(12) United States Patent
Sugar

(10) Patent No.: US 9,679,235 B2
(45) Date of Patent: Jun. 13, 2017

(54) ACTIVE RFID ASSET TRACKING TAG WITH CURRENT-SENSING CABLE CLAMP

(71) Applicant: Emanate Wireless, Inc., Ijamsville, MD (US)

(72) Inventor: Gary Sugar, Rolling Meadows, IL (US)

(73) Assignee: Emanate Wireless, Inc., Ijamsville, MD (US)

(*) Notice: Subject to any disclaimer, the term of this patent is extended or adjusted under 35 U.S.C. 154(b) by 0 days.

(21) Appl. No.: 14/687,018

(22) Filed: Apr. 15, 2015

(65) Prior Publication Data
US 2015/0302288 A1 Oct. 22, 2015

Related U.S. Application Data

(60) Provisional application No. 61/980,138, filed on Apr. 16, 2014.

(51) Int. Cl.
  G06K 19/06 (2006.01)
  G06K 19/07 (2006.01)
  G06K 19/077 (2006.01)
  G01R 19/00 (2006.01)

(52) U.S. Cl.
  CPC ..... *G06K 19/0716* (2013.01); *G01R 19/0092* (2013.01); *G06K 19/0702* (2013.01); *G06K 19/0723* (2013.01); *G06K 19/07758* (2013.01)

(58) Field of Classification Search
  CPC .. G06K 7/10366; H04Q 2209/60; H04Q 9/00; H04Q 2209/47; B60R 25/1004; G08C 17/02
  See application file for complete search history.

(56) References Cited

U.S. PATENT DOCUMENTS

| | | | |
|---|---|---|---|
| 6,275,681 B1 | 8/2001 | Vega et al. | |
| 7,135,974 B2 | 11/2006 | Hernandez et al. | |
| 7,962,130 B2 | 6/2011 | Moorer et al. | |
| 7,964,989 B1 | 6/2011 | Puschnigg et al. | |
| 2003/0197613 A1* | 10/2003 | Hernandez | G06K 19/0701 340/572.8 |
| 2005/0136972 A1 | 6/2005 | Smith et al. | |
| 2005/0237192 A1* | 10/2005 | Krieger | B60R 25/1004 340/568.2 |
| 2006/0113987 A1* | 6/2006 | Sorensen | G01R 15/148 324/117 H |
| 2006/0190538 A1 | 8/2006 | Hwang et al. | |
| 2006/0218415 A1 | 9/2006 | Mak-Fan et al. | |

(Continued)

FOREIGN PATENT DOCUMENTS

| | | |
|---|---|---|
| JP | 2007093469 A | 4/2007 |
| JP | 2012027628 A | 2/2012 |

*Primary Examiner* — Christle I Marshall
*Assistant Examiner* — Asifa Habib
(74) *Attorney, Agent, or Firm* — Edell, Shapiro & Finnan, LLC

(57) ABSTRACT

Configurations are provided for measuring electrical current flow through an AC power cable to a host device. An enclosure is provided that includes various components, such as components of an active RFID tag. A cable clamp is provided that is configured to attach the enclosure to the AC power cable. The cable clamp includes magnetic sensors that are responsive to electrical current flowing through the AC cable to generate signals indicative of the current flowing through the AC cable.

24 Claims, 13 Drawing Sheets

(56) References Cited

U.S. PATENT DOCUMENTS

| | | |
|---|---|---|
| 2007/0015549 A1 | 1/2007 | Hernandez et al. |
| 2008/0049364 A1 | 2/2008 | Campolo et al. |
| 2009/0167494 A1 | 7/2009 | Martins |
| 2009/0180279 A1 | 7/2009 | Bobbin et al. |
| 2010/0026497 A1 | 2/2010 | Choi et al. |
| 2010/0231407 A1* | 9/2010 | Carr .................. G06K 19/0723 340/691.1 |
| 2011/0037565 A1 | 2/2011 | Skirble et al. |
| 2012/0001768 A1* | 1/2012 | Radosavljevic ......... H04Q 9/00 340/870.03 |
| 2012/0151815 A1* | 6/2012 | Tate .................... F16M 11/041 42/90 |
| 2012/0223813 A1 | 9/2012 | Baxter et al. |
| 2012/0319676 A1* | 12/2012 | El-Essawy ......... G01R 33/0283 324/126 |
| 2015/0169915 A1* | 6/2015 | Petre .................. G06K 19/0702 340/10.6 |

\* cited by examiner

ACTIVE RFID ASSET TRACKING TAG WITH CURRENT-SENSING CABLE CLAMP

CROSS REFERENCE TO RELATED APPLICATION

This application claims priority to U.S. Application No. 61/980,138, filed Apr. 16, 2014, the entirety of which is incorporated herein by reference.

TECHNICAL FIELD

The present disclosure relates to wireless indoor positioning systems that track assets such as medical devices and manufacturing equipment.

BACKGROUND

Wireless real-time location systems (RTLS) that track assets, such as medical devices and manufacturing equipment, have been widely deployed in healthcare organizations and other industries. One challenge with these systems is their inability to notify their users whether the assets being tracked are actively being used. For example, imagine how frustrating it would be to walk 15 minutes across a hospital campus to retrieve an infusion pump only to find that it is already being used by someone else.

DESCRIPTION OF EXAMPLE EMBODIMENTS

Presented herein is an active RFID tag that addresses this issue by periodically monitoring the AC current that the asset is consuming, and determining its usage state based on the amount of current being consumed.

Figure 1:
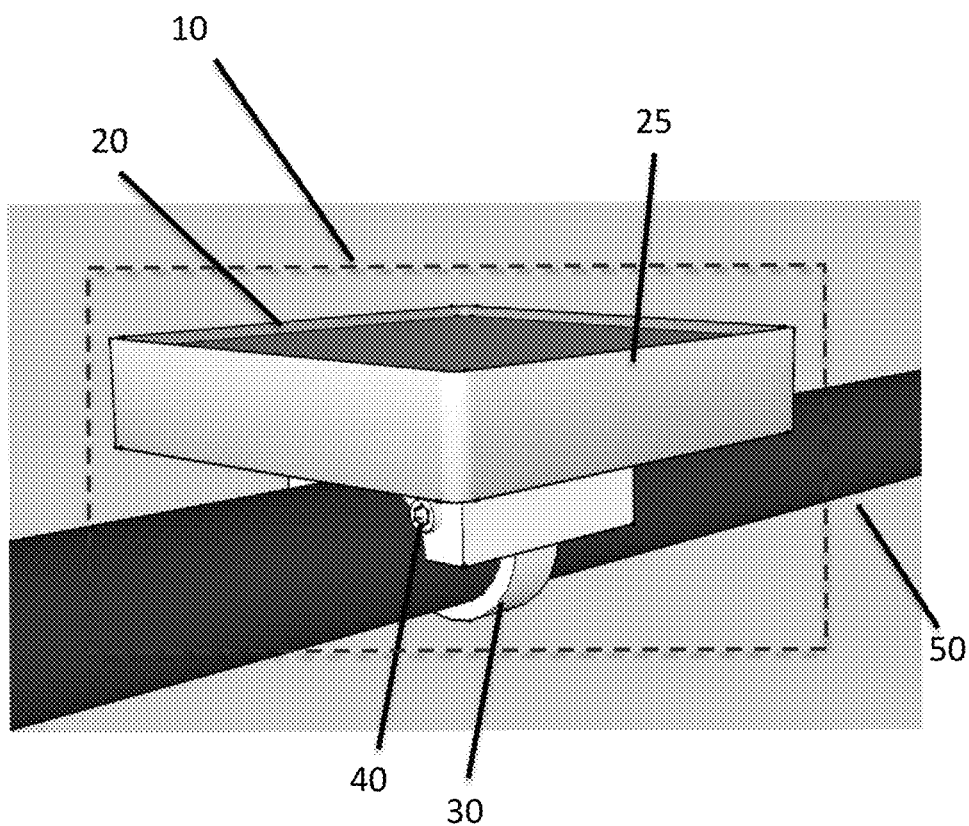
FIG. 1 illustrates an active RFID tag with a current-sensing cable clamp, according to an example embodiment.
Figure 2A:
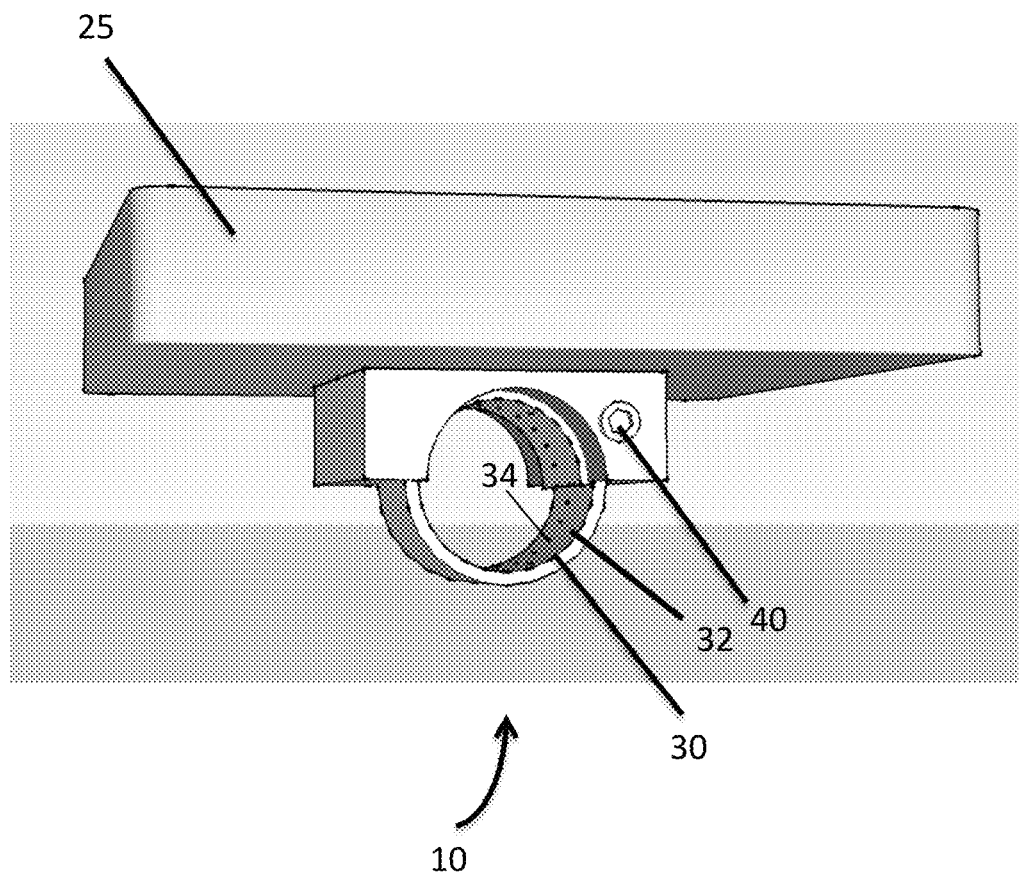
FIG. 2A illustrates a side perspective view of the active RFID tag with current-sensing cable clamp, according to an example embodiment.

Reference is first made to FIGS. 1 and 2A. These figures show, at reference numeral 10, an assembly that includes an RFID tag 20 and a cable clamp 30. The cable clamp 30 is affixed to the RFID tag 20 and has a fastening element, e.g., a screw, 40 that is arranged to adjust the cable clamp 30 to attach around an AC power cord 50 that conveys power to a host device (not shown). Notably the cable clamp 30 attaches to the AC power cord 50 rather than attaching directly to the host device exterior itself as is done with most asset tags today. This is due to the way the tag measures current, as will be described below.

The RFID tag 20 includes an enclosure 25 that contains the tag electronics (including a wireless transceiver, an accelerometer for motion detection, magnetic sensors and associated A/D converters, and a battery). A block diagram of the components of the RFID tag is described hereinafter in connection with FIG. 3. The enclosure 25 may be made of plastic and is about 30×30×10 mm in size. The wireless transceiver (contained within the enclosure) periodically sends out location beacon signals to allow it to be located by one or more wireless sensors.

The cable clamp 30 behaves like a typical cable clamp, but is made of a non-conducting material such as plastic and contains an integrated thin, flexible ribbon cable 32 with magnetic sensors 34 spaced at a certain interval, e.g., every 3-5 mm. The magnetic sensors 34 are used to provide readings on 2 or 3 axes to be manipulated and combined in vector form. The magnetic sensors 34 can be implemented using either standalone integrated circuits such as the Freescale MAG3110, or using discrete circuits. In the latter case each sensor would generally contain one or more magnetic transducers such as a small PCB with 5-10 turns of copper which are fed into a low-noise amplifier before being sampled and digitized in an A/D.

The screw 40 used to tighten the cable clamp 30 around the circumference of the AC cable may be designed to use a non-standard tool to tighten or loosen it. This would make it difficult for someone to (either accidentally or intentionally) separate the tag from its associated asset.

Since the ribbon cable 32 carries conductive material, a tamper detector could be built by running a wire current loop between two pins on a chip in the tag enclosure that extends the entire length of the ribbon cable. Using this approach, if the ribbon cable 32 gets severed, the loop will stop conducting current, indicating the tag was tampered with.

Figure 2B:
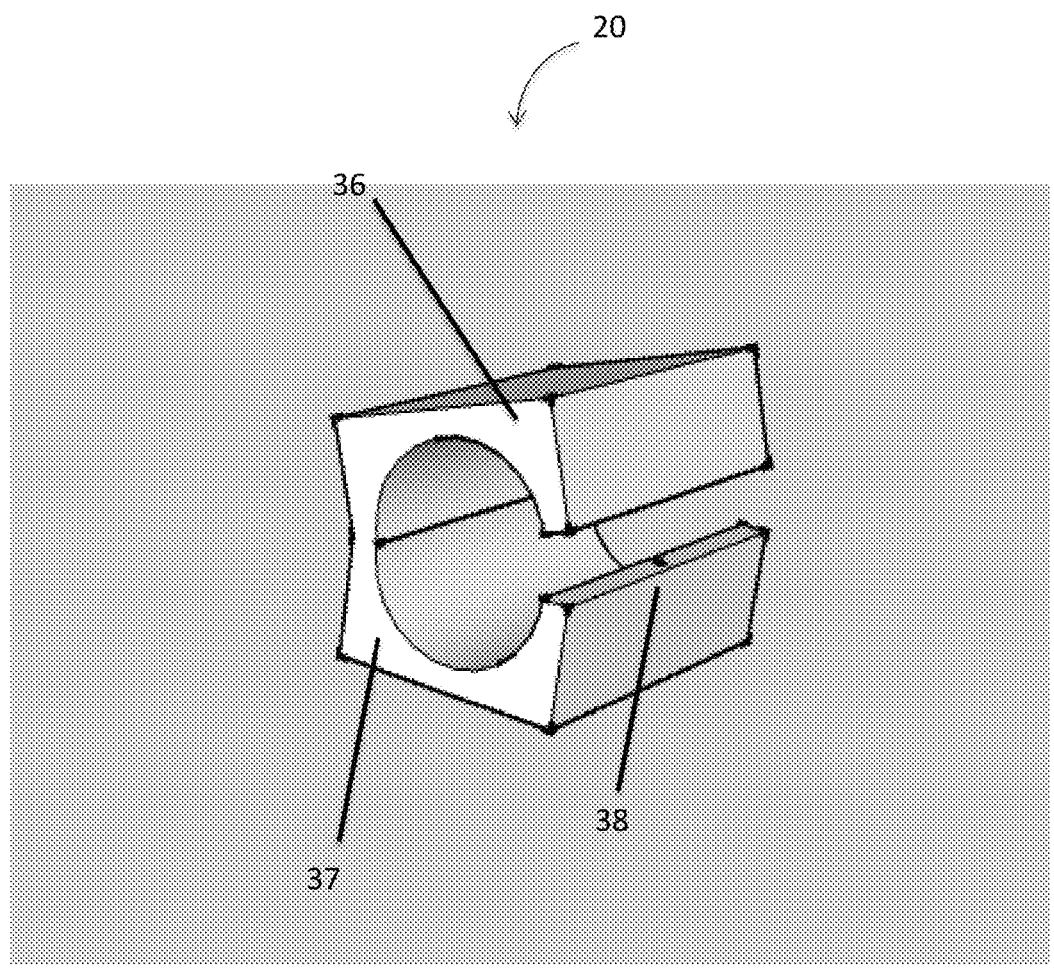
FIG. 2B illustrates a side perspective view of the active RFID tag integrated with or in a current-sensing cable clamp, according to another example embodiment.

Alternative form-factors of the tag 20 are possible. For example, FIG. 2B shows a design that combines the enclosure 25 and cable clamp 30 assemblies into one physical component that is clamped around the AC cable. In this design it is assumed that the magnetic sensors 34 are embedded in the cable clamp part 37 and as such are not visible from the exterior of the tag 20 in this diagram. The wireless transceiver, rechargeable battery, antennas and other tag electronics are located in one of the two (perhaps mostly flat) exterior rectangular walls 36 of the unit. A locking tab or snap 38 is used to hold both sides of the tag together around the AC cable. The unit may be made of plastic, rubber or some other non-metallic material that conducts but does not block the electromagnetic signals being emitted or received by the tag. Thus, in the form-factor of FIG. 2B, there is no separate element that contains the electronics (i.e., the enclosure 25) to which the cable clamp 30 is attached. Rather, one or more walls of the body of the cable clamp assembly 30 serves as the enclosure that contains the electronics.

Figure 3:
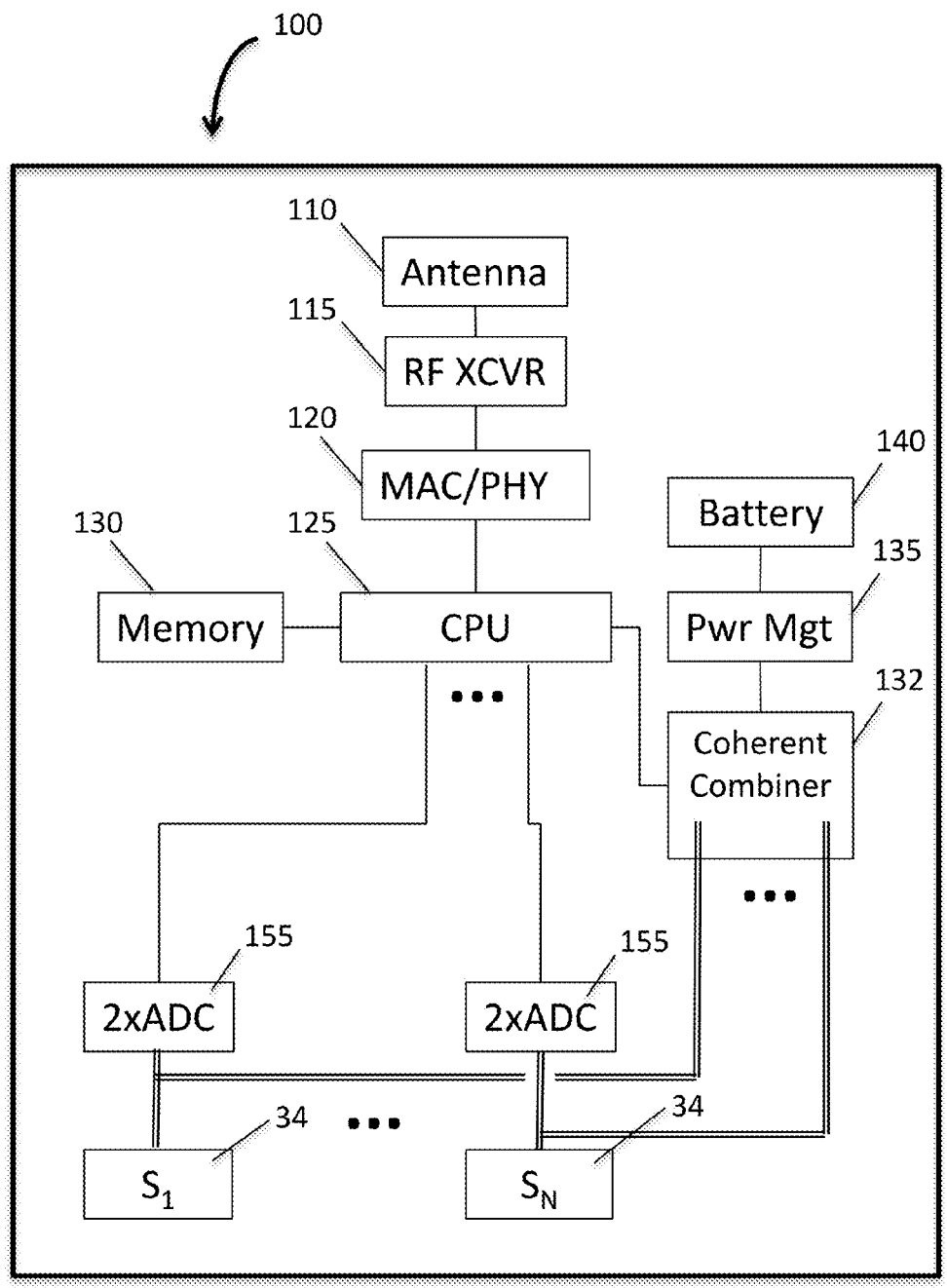
FIG. 3 is a block diagram of the electrical components comprising the active RFID tag, according to an example embodiment.

FIG. 3 illustrates a block diagram of components, shown generally at reference numeral 100, of the RFID tag 20 and the magnetic sensors 34 of the cable clamp 30. There are one or more antennas 110, a radio frequency transceiver (RF XCVR), a media access control/physical (MAC/PHY) processor 120, a central processing unit (CPU) 125, and memory 130. The CPU 125 sends and/or receives location beacon signals over-the-air via IEEE 802.11 Wi-Fi™ (or other similar wireless protocol such as Bluetooth™ or Zigbee™) using the MAC/PHY processor 120, and RF transceiver 115. The magnetic sensors 34 attached to (or inside) the cable clamp assembly 30 are each electrically connected to a complex analog-to-digital converter (ADC) 155 that samples and digitizes the magnitude and phase of the magnetic field from each sensor. Since the AC current running through the cable (and hence the magnetic field outside of the cable as seen by the sensors) fluctuates at 50-60 Hz, the ADCs 155 are time-synchronized to ensure that they sample the sensor outputs at precisely the same time. Each ADC 155 generates complex signal outputs that are fed to the CPU 125 where they are processed periodically to update the current estimate. The instructions executed by the CPU 125 and associated data are stored in a memory 130. A power management (Pwr Mgt) circuit 135 supplies regulated DC power to all the active components on the tag using a battery 140 as its power source.

Figure 4A:
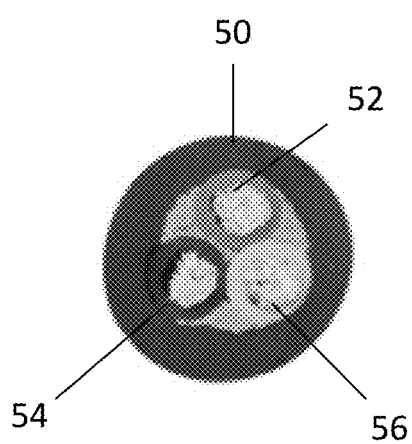
FIG. 4A shows a cross section of a 3 conductor AC power cable.
Figure 4B:
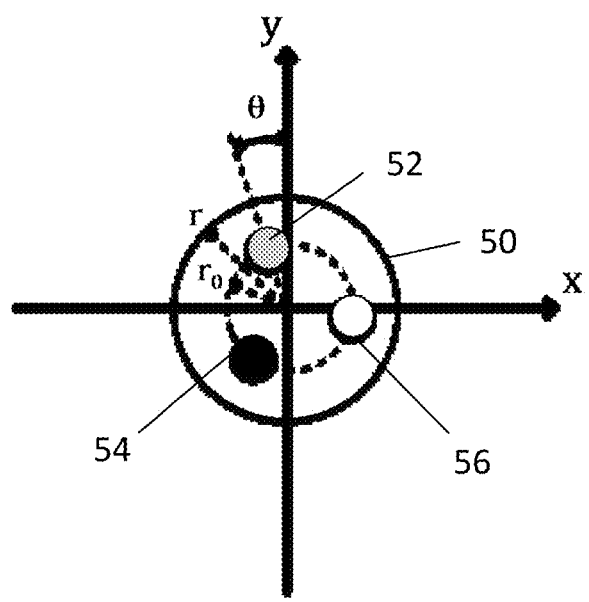
FIG. 4B shows a mathematical model for the AC power cable shown in FIG. 4A.

FIG. 4A shows a cross section of a typical 3 conductor AC power cord 50 and FIG. 4B illustrates a mathematical model of the same that will be used for analysis. A typical cord has the 3 conductors 52, 54 and 56 centered on the vertices of an equilateral triangle, and this assumption is used in the model.

Referring to FIG. 4B, let θ represent the angular distance between the conductor 52 and the y axis, $r_0$ be the distance between the conductor centers and the origin, and let r be the overall radius of the cord, i.e., the distance between the cord center and the outside of its outer insulation. Typical values for $r_0$ and r for 3 conductor cables range from 1.5 to 2.5 mm and 3.0 to 7.0 mm, respectively.

As shown in FIG. 4B, it is assumed that the conductor 52 is centered at coordinates $$p_g = (x_g, y_g) = (r_0 \sin\theta, r_0 \cos\theta) \quad (1)$$

And contains a DC current I/2 running in the positive z direction (coming out of the page), and the conductor 54 is centered at $$p_b = (x_b, y_b) = (r_0 \sin(\theta + 2\pi/3), r_0 \cos(\theta + 2\pi/3)) \quad (2)$$

and has the same current as conductor 42 but running in the opposite direction, i.e., in the negative z direction going into the page. It is assumed that there is no current running through the conductor 56.

Figure 5:
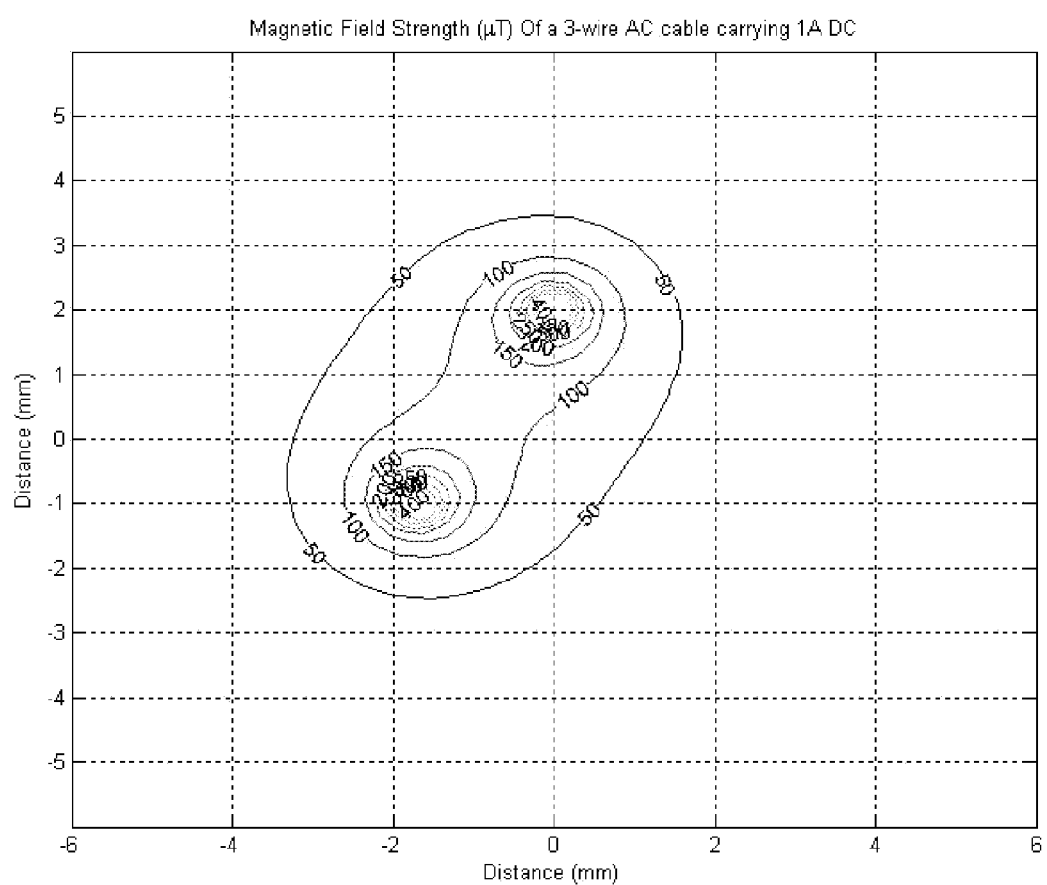
FIG. 5 shows a magnetic field strength contour plot around the cable of FIGS. 4A and 4B when $r_0=2$ mm and $\theta=0$ and a DC current of 1 A is flowing along the +z axis, according to an example embodiment.
Figure 6:
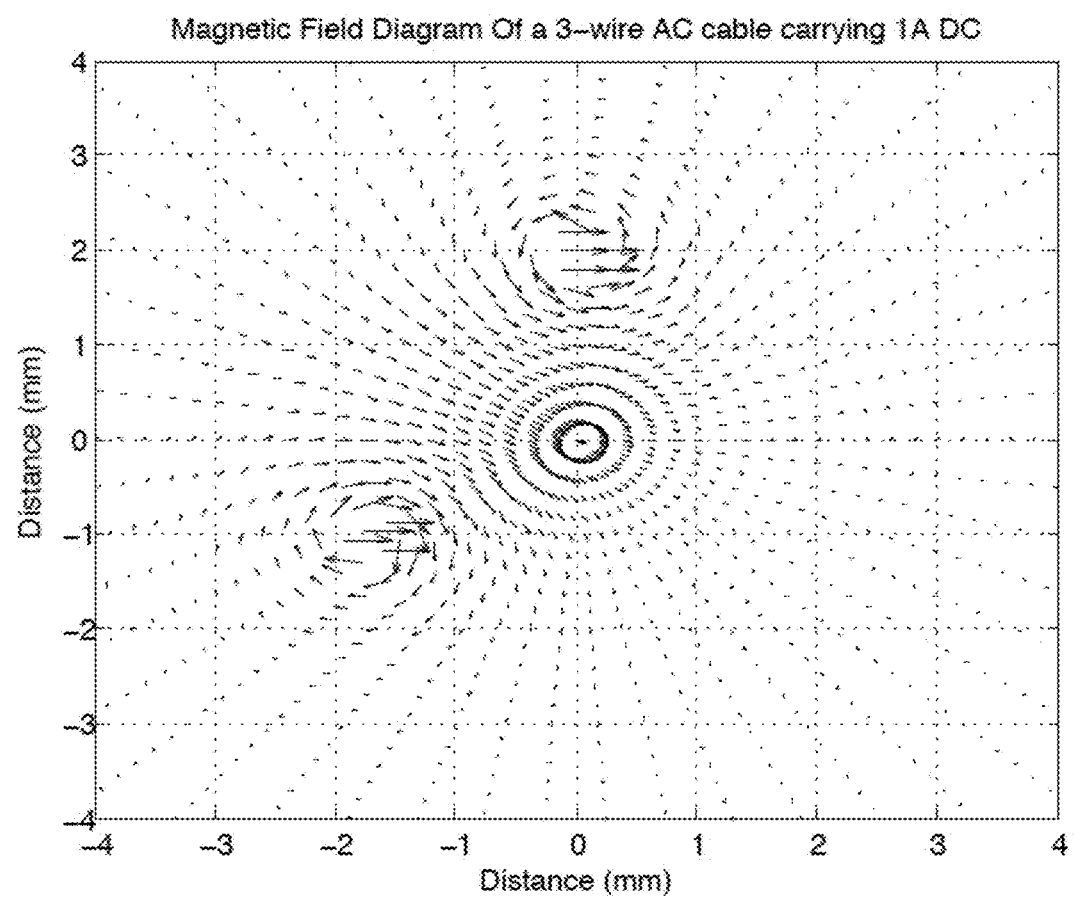
FIG. 6 shows a vector field plot of the magnetic field strength and direction around the cable of FIGS. 4A and 4B when $r_0=2$ mm and $\theta=0$ and a DC current of 1 A is flowing along the +z axis, according to an example embodiment.
Figure 7:
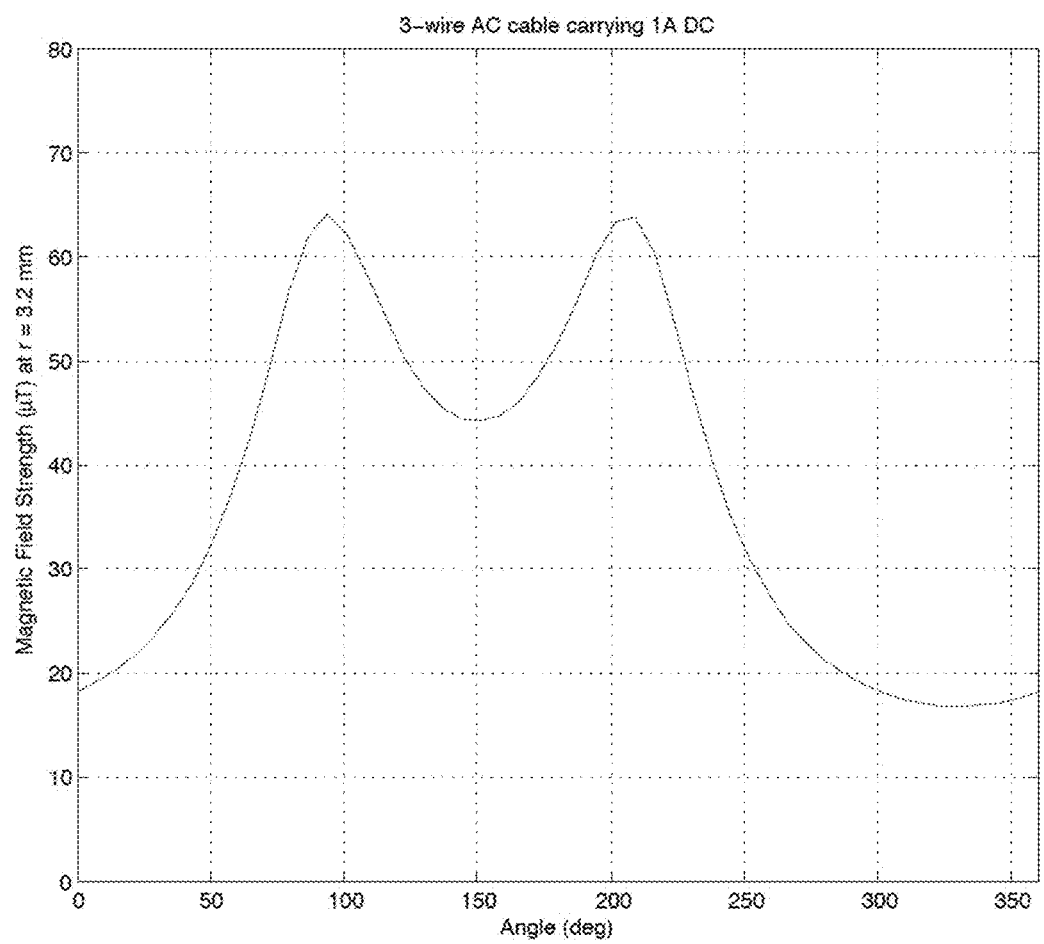
FIG. 7 shows the magnetic field strength at various angular positions along the surface of the cable insulator at $r=3.2$ mm when $r_0=2$ mm, $\theta=0$ and a DC current of 1 A is flowing along the +z axis, according to an example embodiment.

The magnetic field B at a position p=(x, y) in the xy plane due to the conductors 52 and 54 can be shown to be $B_g + B_p$, where $$B_g = \frac{\mu_0 I}{4\pi \|p - p_g\|^2}(p - p_g) \quad (3)$$

and $$B_b = \frac{-\mu_0 I}{4\pi \|p - p_b\|^2}(p - p_b). \quad (4)$$

are the magnetic fields due to the conductors 52 and 54, respectively. The $\mu_0$ parameter in these expressions is the magnetic permittivity constant $\mu_0 = 4\pi \times 10^{-7}$ T·m/A. Note that the magnetic fields $B_g$ and $B_b$ in these expressions are vectors, i.e., they have both a magnitude and a direction. FIGS. 5 and 6 show contour and vector field plots of the combined field B when I=1 A, θ=0, $r_0$=2.0 mm, and r=3.2 mm. FIG. 7 shows how the total field strength varies along the outer circumference of the cable, i.e., on the circle of radius r=3.2 mm.

Let d be the distance between the sensors on the inner surface of the cable clamp 30. When the clamp is tightened so that the sensors are positioned on the outer circumference of the cable, there will be $$N = \left\lfloor \frac{2\pi r}{d} \right\rfloor$$

sensors that fit around the outer circumference (the N+1$^{st}$ sensor will overlap with the 1$^{st}$ sensor and so on). The distance d may be selected so that at least N=4 sensor readings can be obtained for the thinnest cables (i.e., r≈3 mm) to provide adequate sampling, and there should be enough sensors on the clamp to ensure that the entire circumference can be covered for the fattest cables (i.e., r≈7 mm). When the clamp 30 is tightened so that the sensors are positioned on the outer circumference of the cable, the sensor positions can be written as:

$$p_n = (r \cos nd/r, r \sin nd/r), n = 0, \ldots, \left\lfloor \frac{2\pi r}{d} \right\rfloor - 1 \quad (5)$$

The radius of the cable r is the only unknown quantity in the above expression. Note from equation (5) that the first (n=0) sensor is assumed to be positioned on the +y axis; in fact it is used to define the location of the +y axis, the +x axis, and the coordinate system for all the current measurements. Each of the sensors is oriented differently from one another in 3D space, so their magnetic field readings will require coordinate transformations (from the local coordinate systems for each sensor to one global coordinate system) before they can be combined as vector quantities in any meaningful way.

Current Measurement Technique

Figure 8:
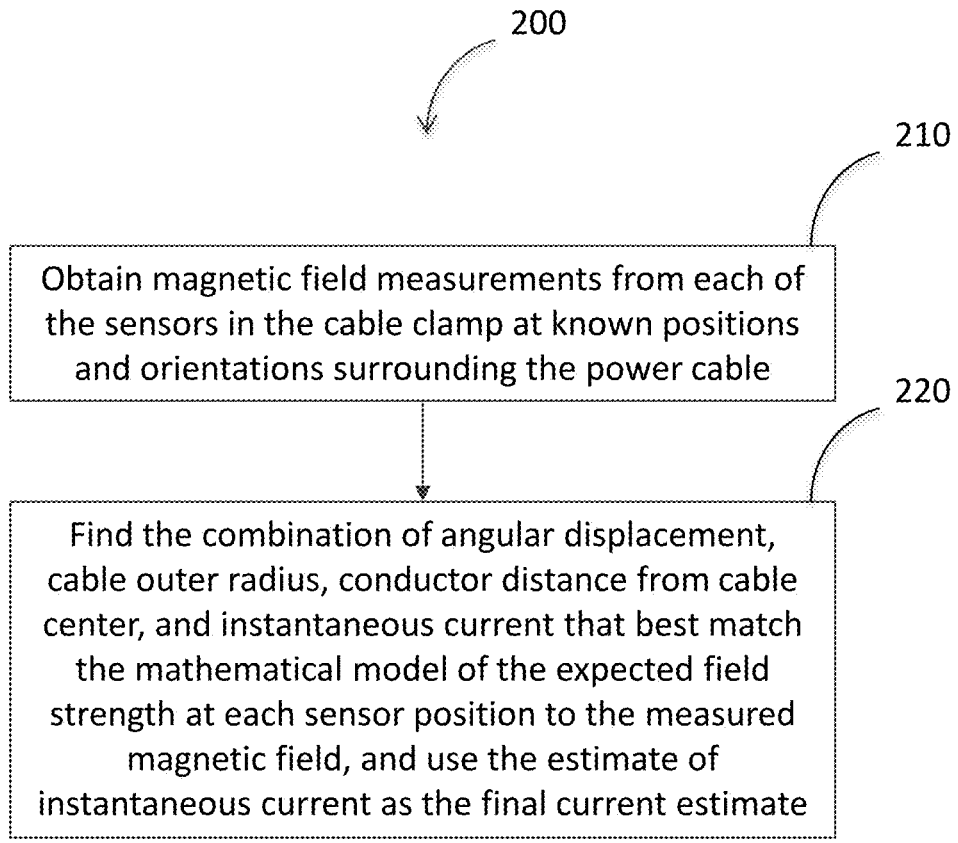
FIG. 8 is a flow chart of a method according to an example embodiment.

Reference is now made to FIG. 8 which illustrates a flow chart for a current measuring method 200. The RFID tag reads the field strength from the magnetic sensors of the cable clamp and uses the following steps to map these readings to an estimate of the current running through the cable:

At 210, the magnetic field measurements $B_n$, $n=0, \ldots, N-1$ are obtained from each of the N sensors at known positions $p_n$ surrounding the AC cable (see equation (5)). As described above, if the sensors are oriented differently from one another, any necessary coordinate transformations are performed to map the measurements to the same coordinate system.

At 220, the current is estimated by finding the combination of angular displacement $\theta$, cable outer radius $r$, conductor distance from cable center $r_0$, and current $\hat{I}$ that best match the mathematical model of the expected field strength at positions $p_n$ to the magnetic field measurements $B_n$, and use the estimate $\hat{I}$ as the final current estimate. The "best match" may mean in the minimum mean-square error sense, i.e., $$\hat{I} = \operatorname{argmin}_I \min_{r, r_0, \theta} \frac{1}{\left\lfloor \frac{2\pi r}{d} \right\rfloor} \sum_{n=0}^{\left\lfloor \frac{2\pi r}{d} \right\rfloor - 1} |B_n - \hat{B}_n(r, r_0, \theta, I)|^2, \quad (6)$$

where $$\hat{B}_n(r, r_0, \theta, I) \triangleq \frac{\mu_0 I}{4\pi} \left[ \frac{p_n - p_g}{\|p_n - p_g\|^2} - \frac{p_n - p_b}{\|p_n - p_b\|^2} \right] \quad (7)$$

is the expected magnetic field vector at positions $p_n$ given model parameters $r$, $r_0$, $\theta$, and $I$, $$p_g = (r_0 \sin\theta, r_0 \cos\theta) \quad (8)$$

$$p_b = \left(r_0 \sin\left(\theta + \frac{2\pi}{3}\right), r_0 \cos\left(\theta + \frac{2\pi}{3}\right)\right). \quad (9)$$

and $p_n$ is defined in equation (5) (note that $p_n$ depends on the outer radius $r$).

The operations of 210 and 220 are repeated several times to compute the RMS, yielding an RMS current estimate.

The computation of $\hat{I}$ in equation (6) involves a 4D search. There are a number of ways to simplify the computation:

(1) The cable outer radius $r$ can be determined electromechanically, e.g., by sensing how much the screw was tightened, or sensing how much of the clamp material covers the circumference of the cable. This would remove the need to search for $r$ in (6).

(2) There is no need to search for $I$ per se as it can be computed mathematically. For a fixed choice of $r$, $r_0$ and $\theta$, the I that minimizes (6) can be shown to be $$\hat{I} = \frac{\sum_{n=0}^{\left\lfloor \frac{2\pi r}{d} \right\rfloor - 1} \hat{B}_n(r, r_0, \theta) B_n^*}{\sum_{n=0}^{\left\lfloor \frac{2\pi r}{d} \right\rfloor - 1} |\hat{B}_n(r, r_0, \theta)|^2}, \quad (10)$$

where $$\hat{B}_n(r, r_0, \theta) = \frac{\mu_0}{4\pi} \left[ \frac{p_n - p_g}{\|p_n - p_g\|^2} - \frac{p_n - p_b}{\|p_n - p_b\|^2} \right].$$

(3) From inspection of the plot in FIG. 7, note that the peaks in the magnetic field strength occur at the angular positions $\theta$ and at $\theta + \pi/3$ of the green and black conductors.

Thus a coarse estimate for $\theta$ can be found by finding the angular position of the first peak among the magnetic sensor readings $B_n$. The coarse estimate can be refined by interpolating between the first peak position and the adjacent positions. The coarse estimate will help limit the search range for $\theta$ in (6).

(4) In addition, note from FIG. 7 that the minimum field strength is 180 degrees away from the angular midpoint between the two current-carrying conductors. This suggests the following estimator for $\theta$ that is independent of $r_0$ and $I$ (but dependent on $r$):

(a) Find the sensor $n_0$ that has the minimum field strength, i.e., $|B_{n_0}| \leq |B_n|$ for $n=0, \ldots, N-1$.

(b) Fit a parabola to the 3 sensor readings $|B_n|$, $n=n_0-1, n_0, n_0+1$. Let $n^*$ be the vertex of that parabola (n will be a fractional number between $n_0-1$ and $n_0+1$, is an interpolated estimate of the angular position that has the minimum field strength). That angular position, in radians, is $$\frac{n_* d}{r}.$$

The estimate for $\theta$ is $$\frac{n_* d}{r} - \pi.$$

AC RMS Current Measurements

Figure 9:
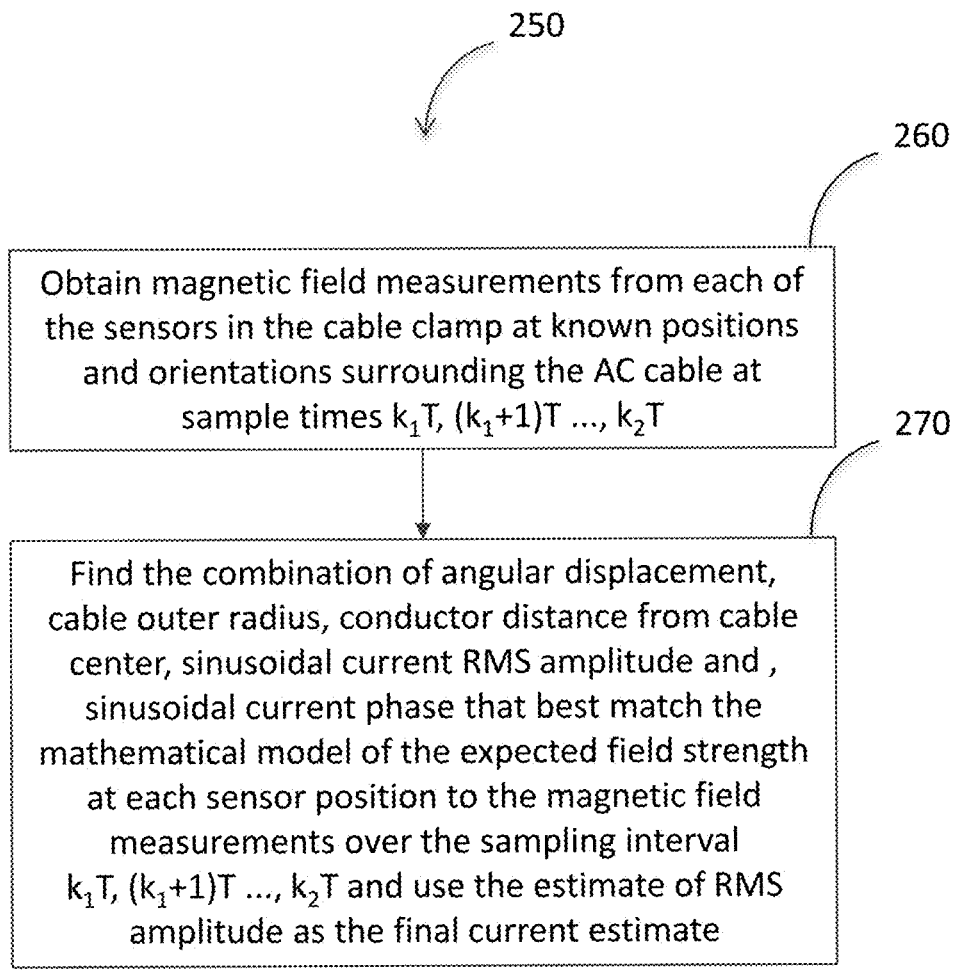
FIG. 9 is a flow chart of a method according to another example embodiment.

Method 200 can be used to measure a DC current or the value of an AC current in the cable at a particular instance in time. Referring to FIG. 9, one can augment this procedure to measure the RMS current of a sinusoidally varying AC current by the process 250, as follows.

At 260, the time-varying magnetic sensor outputs $B_n(t)$ are sampled at times $kT$, $k=k_1, \ldots, k_2$ using a sampling period $T < 4\pi/\omega$ yielding $B_n(kT)$, $k=k_1, \ldots, k_2$. As described earlier, if the sensors are oriented differently from one another, any necessary coordinate transformations are performed to map the measurements to the same coordinate system.

At 270, one finds the combination of angular displacement $\theta$, cable outer radius $r$, conductor distance from cable center $r_0$, sinusoidal current RMS amplitude $I_0$ and sinusoidal current phase $\varphi$ that best match the mathematical model of the expected field strength at positions $p_n$ to the magnetic field measurements over the observation interval $kT$, $k=k_1, \ldots, k_2$. and use the estimate $I_0$ as the final current estimate. The "best match" may mean in the minimum mean-square error sense, i.e., $$\hat{I}_0 = \operatorname{argmin}_{I_0} \min_{r, r_0, \theta, \varphi} \frac{1}{\left\lfloor \frac{2\pi r}{d} \right\rfloor} \sum_{k=k_1}^{k_2} \sum_{n=0}^{\left\lfloor \frac{2\pi r}{d} \right\rfloor - 1} |B_n(kT) - \hat{B}_n^{AC}(r, r_0, \theta, I_0, kT, \varphi)|^2, \quad (11)$$

where $$\hat{B}_n^{AC}(r, r_0, \theta, I_0, kT, \varphi) = \frac{\sqrt{2} \mu_0 I_0 \sin(\omega kT + \varphi)}{4\pi} \left[ \frac{p_n - p_g}{\|p_n - p_g\|^2} - \frac{p_n - p_b}{\|p_n - p_b\|^2} \right]$$

is the expected magnetic field at position $p_n$ and sample time kT when a sinusoidal current with RMS amplitude $I_0$ and phase $\phi$ and is present in the cable.

Inferring Usage State from Current Measurements

Once the current consumption of the host device has been determined, the usage state can be inferred in most cases by applying a threshold to the current, i.e., conclude the device is actively being used if the current exceeds a (generally device-specific) threshold. The device-specific thresholds can be determined in advance and stored in either a database, or stored locally in non-volatile memory on the device.

Battery Charging

One other well-known challenge with current RTLS tags that can be addressed with the cable clamp approach comes from their need for battery replacement. Most RTLS tags being used today have single-use batteries that must be changed approximately twice a year. Since most hospitals that deploy RTLS use thousands of tags, the operational and material costs of changing their batteries are significant.

Figure 10A:
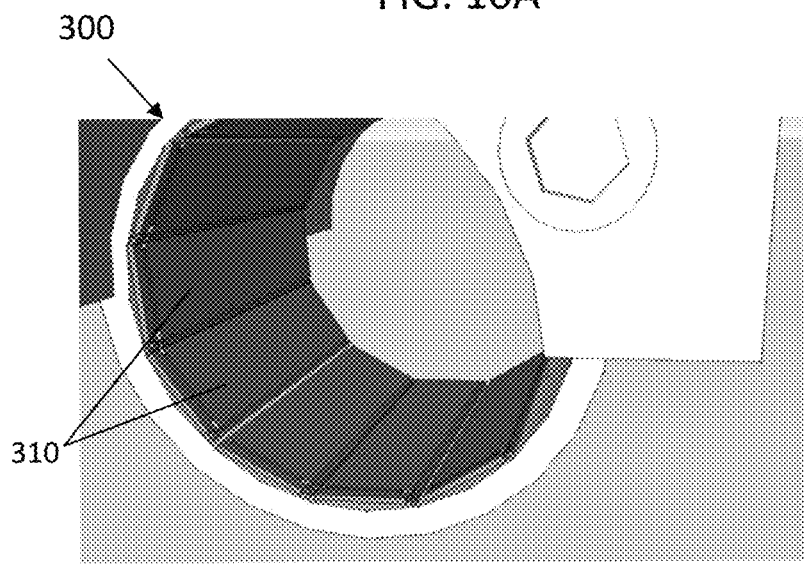
FIG. 10A is a diagram illustrating an arrangement of magnetic sensors in the cable clamp according to another example embodiment.
Figure 10B:
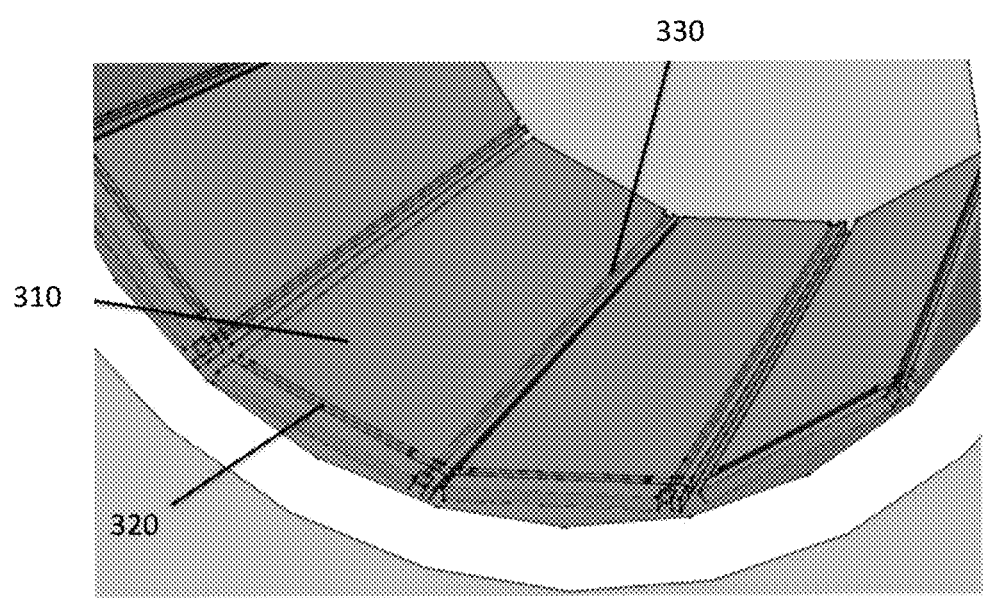
FIG. 10B is an enlarged partial view of the cable clamp of FIG. 10A, and illustrating the magnetic sensors in greater detail, according to an example embodiment.

FIGS. 10A and 10B shows how the current clamp approach can be modified to generate enough current to recharge a battery inside the tag. The modified cable clamp is shown generally at 300, and includes a plurality of magnetic sensors 310 positioned around the circumference of the clamp. Each sensor 310 consists of a metal bar containing iron or another magnetic material and a pair of wire coils (inductors) 320 and 330 that are used to couple the magnetic energy generated along two perpendicular axes of the bar, that is, to couple energy from both the radial and tangential directions around the clamp. The instantaneous voltage difference between the terminals of each coil is digitized by the complex ADC 155 shown in FIG. 3. Note, for this configuration, there are two physical ADCs (one assigned to each of the two coils) per magnetic sensor 310. The term "complex ADC" refers to the pair of real ADCs assigned to each sensor. This approach would remove the need to replace or manually recharge the RFID tag's battery 140 (see FIG. 3) as long as the asset is plugged in and turned on at some minimal frequency.

The iron bar sensors should not touch one another to ensure that their fields are isolated. The wire-wrapped inductors 320 and 330 are used to convert the magnetic field around the cable into a set of voltage signals that are proportional to the time derivative of the current flowing through the cable. The two inductor leads from each iron bar sensor 310 are fed through a coherent combiner circuit 132 in the RFID tag enclosure and shown in FIG. 3. When an AC current flows in the cable, the coherent combiner 132 is used to phase align and sum each of the sensor outputs. This step is performed since a large amount of phase cancellation is expected due to Ampere's law, which states that the line integral of the magnetic field around the circumference of the cable is equal to the net current through the cross section of the cable, which is identically zero when both the conductors 52 and 54 of the cable 50 (FIGS. 4A and 4B) are enclosed in the clamp 30.

Figure 11:
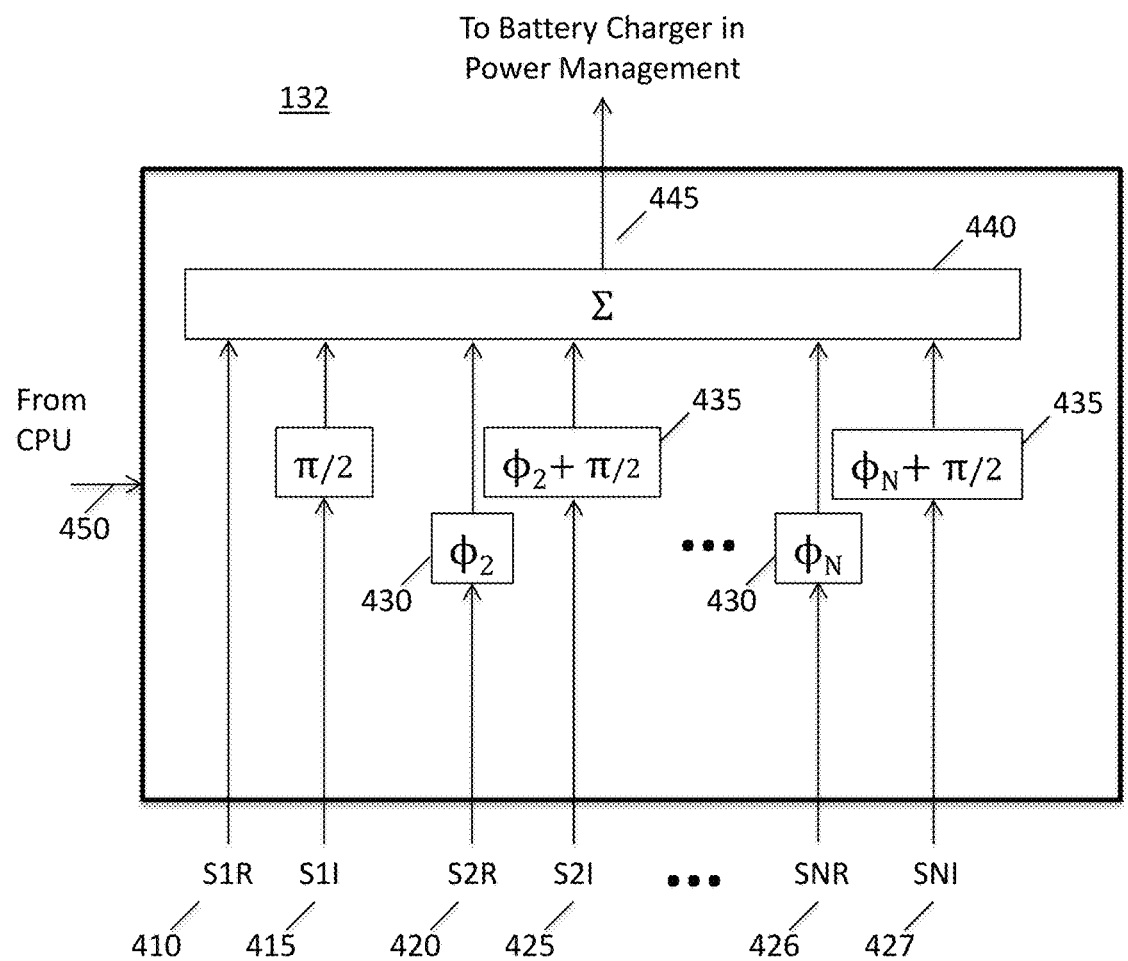
FIG. 11 is a functional block diagram of a coherent combiner circuit according to an example embodiment.

FIG. 11 shows a functional block diagram of the coherent combiner 132. The analog signals representing the real and imaginary parts of the first sensor output are fed into input ports 410 and 415 of the combiner, resp. The real and an imaginary parts of the second sensor output are fed into ports 420 and 425, resp., and the real and imaginary parts of the last (Nth) sensor output are fed into ports 426 and 427, respectively. The input signals are fed into programmable phase shifters 430, 435 to adjust the phase of sensor outputs $2, \ldots, N$ relative to that of the $1^{st}$ sensor output and summed by summer 440 yielding the combiner output signal 445.

The phase delay parameters $\phi_2, \ldots, \phi_N$ are programmed into the phase shifters 430, 435 by the CPU 125 (shown in FIG. 3). The imaginary signals are phase shifted by 90 degrees more than the real signals in order to remove the fixed, known phase offset of 90 degrees between those signals, further increasing the output signal level at 445. The combiner output signal 445 is fed into the power management 135 block (which may be a dedicated integrated circuit) (see FIG. 3), where it is rectified, filtered and regulated into a DC power signal which is ultimately used to charge the battery when the tagged device is plugged into a power mains.

Figure 12:
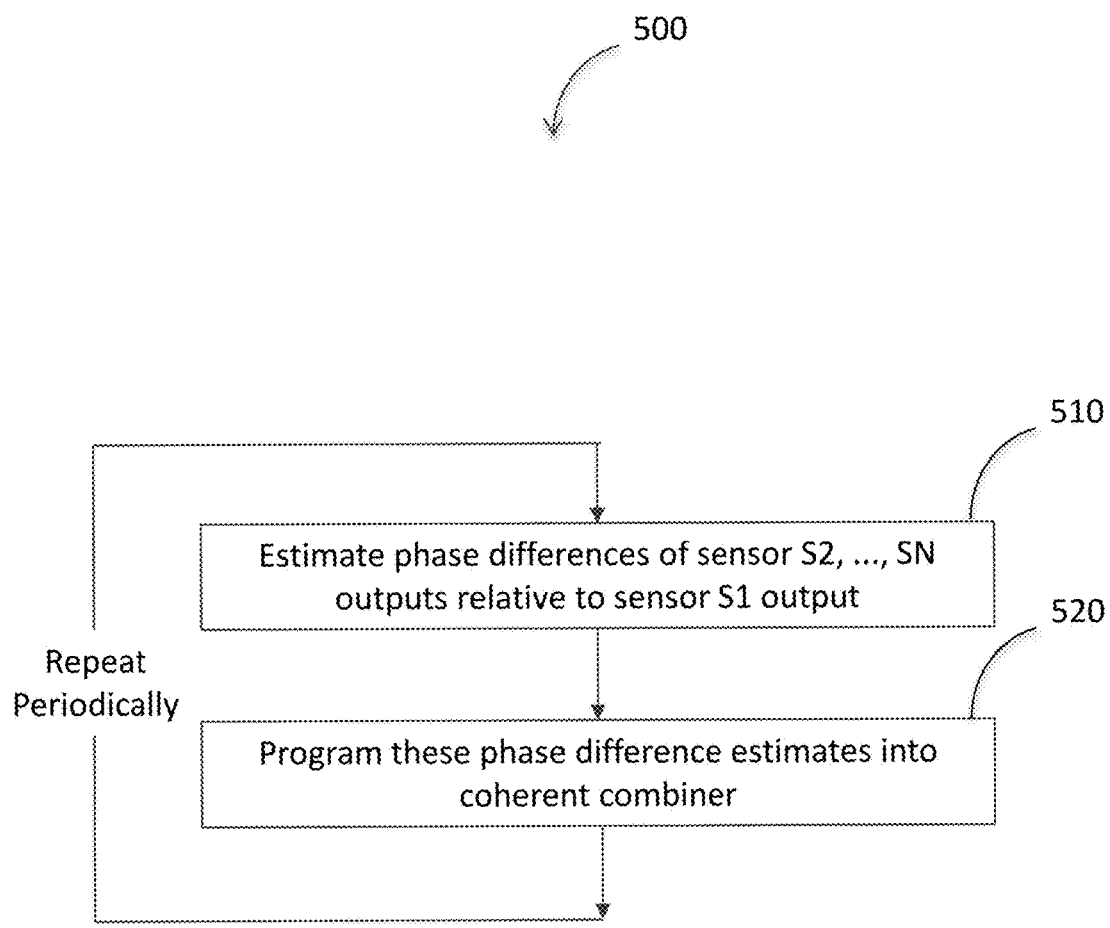
FIG. 12 is a flow chart of a method for estimating phase differences between magnetic sensor output signals according to an example embodiment.

FIG. 12 shows a flow chart for a method 500 that can be used to adjust the programmable phase delays 430, 435 in the CPU 125 (FIG. 3) in order to maximize the combiner output signal 445 level and minimize phase cancellation. At 510, the CPU estimates the phase differences $\phi_2, \ldots, \phi_N$ between sensor outputs $2, \ldots, N$ and the first sensor output. One way to estimate the phase difference $\phi_n$ between the nth and $1^{st}$ sensor output is to apply the formula $$\hat{\phi}_n = \tan^{-1} \frac{\sum_k B_n(kT)^* B_1(kT)}{\sqrt{\sum_k |B_n(kT)|^2 \sum_k |B_1(kT)|^2}}$$

which gives the maximum likelihood estimate of the phase difference $\phi_n$ between sensor n and sensor 1 output signals given their sampled observation vectors $B_n(kT)$ and $B_n(kT)$, kT, $k=k_1, \ldots, k_2$.

At 520, once the phase differences $\phi_2, \ldots, \phi_N$ have been estimated, the CPU negates (applies a negative to) these estimated phase differences and writes the negative phase differences $-\phi_2, \ldots, -\phi_N$ to the programmable phase registers in the coherent combiner 132.

Steps 510 and 520 can be repeated periodically by the CPU 125, although in theory an update is only required when the physical orientation of the tag and its sensors changes relative to the cable, i.e., when the tag has moved or removed from the cable.

Split Cable Approach

Another modification to the cable clamp approach that can be used for both current monitoring and battery charging involves the use of a special extension cord between the power cable and the powered asset that has its insulated conductors exposed. This approach, referred to as the "Split Cable Approach", is technically similar to the approach used in AC current meters today and is considerably less complex than the other approaches discussed earlier. The advantages of this approach are its simplicity and lower manufacturing cost since, as will be discussed shortly, fewer magnetic sensors are required; the disadvantage is that it requires the special extension cord to expose the 3 conductors, which adds back some cost and is aesthetically less attractive.

The cable clamp design would consist of a single iron core (or multiple connected iron cores inside the plastic clamp material) with a single attached wire-wrapped inductor to couple the magnetic field energy runs tangentially around the core. The iron core would be designed to loop snuggly around the positive (green) current-carrying conductor of the 3-conductor extension cable; the other two conductors would pass through the clamp (similar to an AC current meter). The voltage at the output of the inductor is proportional to the time derivative of the current signal running through the green conductor. This signal can be used to either charge the battery or measure how much current is running through the power cord.

To summarize, in one embodiment, presented herein are arrangements of an active RFID tag that is configured to monitor current flow through a cable (e.g., AC power cable) that is connected to a "host" device in order to supply electrical power to the host device. The active RFID tag includes a clamp assembly configured to clamp to an AC power cable, wherein the clamp assembly includes a plurality of magnetic field sensors configured to generate signals indicative of a measure of electrical current flowing through the AC power cable to a host device to which the RFID tag is associated; and an enclosure configured to contain a battery and a wireless transceiver. The enclosure may be defined by one or more walls of a body of the clamp assembly, or the enclosure may be a separate element and the claim assembly is configured to attach to the enclosure.

In one form, a processor is contained in the enclosure and is configured to process signals obtained from the magnetic field sensors to generate the measure of electrical current flowing through the AC power cable. In another form, the processor is configured to process signals obtained from the magnetic field sensors to generate a power usage state of the host device to which the AC power cable is connected. A fastening element (such as a screw) is provided and is configured to be adjusted using a special tool that is not generally available. In still another form, the clamp includes a ribbon cable and a conductive current loop inside the ribbon cable such that loss of electrical current conducted through the current loop indicates that the ribbon cable has been severed. In still another form, the processor is configured to determine a set of model parameters that best match magnetic field readings from the plurality of magnetic field sensors to a mathematical model for the magnetic field readings, and to use a best-match current as an estimate of current flow through the AC power cable.

In another embodiment, a device is provided comprising device including a clamp assembly configured to clamp to an AC power cable, wherein the clamp assembly includes a plurality of magnetic field sensors; and an enclosure configured to contain a battery and a processor. The processor is configured to generate an estimate of current flow through the AC power cable from outputs of the plurality of magnetic field sensors by finding a set of model parameters that best match magnetic field readings from the plurality of magnetic field sensors to a mathematical model for said magnetic field readings, and using a best-match current as the estimate of current flow through the AC power cable.

In still another embodiment, an active RFID tag is provided including a clamp assembly configured to clamp to an AC power cable, wherein the clamp assembly includes a plurality of magnetic field sensors configured to generate output signals based on electrical current flowing through the AC power cable; and an enclosure configured to contain a rechargeable battery, a wireless transceiver, and a combiner circuit configured to combine the output signals from the magnetic field sensors to produce power to charge the rechargeable battery.

The above description is intended by way of example only. Various modifications and structural changes may be made therein without departing from the scope of the concepts described herein and within the scope and range of equivalents of the claims.

What is claimed is:

1. An active radio frequency identifier (RFID) tag comprising:
    a clamp assembly configured to clamp around an AC power cable that comprises an outer insulator wrapped around two or more insulated inner conductors, wherein the clamp assembly includes a plurality of magnetic field sensors spaced around the outer insulator of the AC power cable, wherein the magnetic field sensors are configured to generate magnetic field strength measurements at different positions around the AC power cable, wherein the magnetic field strength measurements are used collectively to generate an estimate of electrical current flowing through one inner conductor of the AC power cable to a host device to which the RFID tag is associated;
    a processor coupled to the plurality of magnetic field sensors and configured to search for a combination of AC power cable parameters, including instantaneous current, that best match a mathematical model of expected magnetic field strength at each magnetic field sensor position to the magnetic field strength measurements, and use an estimate of instantaneous current as a final current estimate of current flowing through the one conductor in the AC power cable; and
    an enclosure configured to contain a battery and a wireless transceiver.

2. The active RFID tag of claim 1, wherein the enclosure is defined by one or more walls of a body of the clamp assembly.

3. The active RFID tag of claim 1, wherein the enclosure is a separate element, and the clamp assembly is configured to attach to the enclosure.

4. The active RFID tag of claim 1, wherein the processor is further configured to process signals obtained from the magnetic field sensors to generate a usage state of the host device to which the AC power cable is connected.

5. The active RFID tag of claim 1, further comprising a fastening element configured to fasten the clamp assembly to the AC power cable, wherein the fastening element is adjustable.

6. The active RFID tag of claim 5, wherein the fastening element is a screw.

7. The active RFID tag of claim 1, where the clamp assembly includes a ribbon cable and a conductive current loop inside the ribbon cable such that loss of electrical current conducted through the current loop indicates that the ribbon cable has been severed.

8. The active RFID tag of claim 1, wherein the AC power cable parameters further include angular displacement, cable outer radius, and conductor distance from cable center.

9. The active RFID tag of claim 8, wherein the processor is configured to compute the best match to the mathematical model using a minimum mean-square-error computation.

10. The active RFID tag of claim 8, wherein the cable outer radius is determined electro-mechanically by sensing how much a screw of the clamp assembly is tightened or by sensing how much of the clamp material covers a circumference of the cable.

11. A device comprising:
    a clamp assembly configured to clamp around an AC power cable that comprises an outer insulator wrapped around two or more insulated inner conductors, wherein the clamp assembly includes a plurality of magnetic field sensors spaced around the outer insulator of the AC power cable, wherein the magnetic field sensors are configured to generate magnetic field strength measurements at different positions around the AC power cable; and an enclosure configured to contain a battery and a processor;

wherein the processor is configured to generate an estimate of current flow through one inner conductor of the AC power cable from outputs of the plurality of magnetic field sensors by searching for a combination of AC power cable parameters, including instantaneous current, that best match a mathematical model of magnetic field readings at the different positions around the AC power cable from the plurality of magnetic field sensors, and using an estimate of instantaneous current as a final current estimate of current flowing through the one conductor in the AC power cable.

12. The device of claim 11, wherein the enclosure is defined by one or more walls of a body of the clamp assembly.

13. The device of claim 11, wherein the enclosure is a separate element, and the clamp assembly is configured to attach to the enclosure.

14. The device of claim 11, wherein the processor is further configured to process signals obtained from the magnetic field sensors to generate a usage state of a device to which the AC power cable is connected.

15. The device of claim 11, further comprising a fastening element configured to attach the clamp assembly to the AC power cable, wherein the fastening element is adjustable.

16. The device of claim 11, the clamp assembly includes a ribbon cable and a conductive current loop inside the ribbon cable such that loss of electrical current conducted through the current loop indicates that the ribbon cable has been severed.

17. The device of claim 11, wherein the AC power cable parameters further include angular displacement, cable outer radius, and conductor distance from cable center.

18. The device of claim 17, wherein the processor is configured to compute the best match to the mathematical model using a minimum mean-square-error computation.

19. The active RFID tag of claim 18, wherein the processor is configured to compute the best match to the mathematical model using a minimum mean-square-error computation.

20. An active radio frequency identifier (RFID) tag comprising:

a clamp assembly configured to clamp around an AC power cable that comprises an outer insulator wrapped around two or more insulated inner conductors, wherein the clamp assembly includes a plurality of magnetic field sensors spaced around the outer insulator of the AC power cable and configured to generate magnetic field strength measurements at different positions around the AC power cable, wherein the magnetic field strength measurements are used collectively to generate an estimate of electrical current flowing through one inner conductor of the AC power cable;

a processor coupled to the plurality of magnetic field sensors and configured to search a combination of AC power cable parameters, including instantaneous current, that best match a mathematical model of expected magnetic field strength at each magnetic field sensor position to the magnetic field strength measurements, and use an estimate of instantaneous current as a final current estimate of current flowing through the one conductor in the AC power cable; and an enclosure configured to contain a rechargeable battery, a wireless transceiver, and a combiner circuit configured to combine output signals from the magnetic field sensors to produce power to charge the rechargeable battery.

21. The active RFID tag of claim 20, wherein the processor is configured to process signals obtained from the magnetic field sensors to generate a usage state of a device to which the AC power cable is connected.

22. The active RFID tag of claim 20, wherein the enclosure is defined by one or more walls of a body of the clamp assembly.

23. The active RFID tag of claim 20, wherein the enclosure is a separate element, and the clamp assembly is configured to attach to the enclosure.

24. The active RFID tag of claim 20, wherein the AC power cable parameters further include angular displacement, cable outer radius, and conductor distance from cable center.

* * * * *